US006818548B2

(12) United States Patent
Lavric et al.

(10) Patent No.: US 6,818,548 B2
(45) Date of Patent: Nov. 16, 2004

(54) FAST RAMP ANNEAL FOR HILLOCK SUPPRESSION IN COPPER-CONTAINING STRUCTURES

(75) Inventors: Dan S. Lavric, Portland, OR (US); Stephen T. Chambers, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/283,674

(22) Filed: Oct. 29, 2002

(65) Prior Publication Data

US 2004/0087147 A1 May 6, 2004

(51) Int. Cl.[7] ................... H01L 21/4763; H01L 21/302; H01L 21/431
(52) U.S. Cl. ........................ 438/626; 438/663; 438/675; 438/691
(58) Field of Search ................................. 438/626, 663, 438/671, 675, 691

(56) References Cited

U.S. PATENT DOCUMENTS

| 6,348,410 B1 | 2/2002 | Ngo et al. |
| 6,368,948 B1 | 4/2002 | Ngo et al. |
| 6,391,777 B1 | 5/2002 | Chen et al. |
| 2002/0098710 A1 * | 7/2002 | Sandhu et al. ............. 438/732 |

* cited by examiner

Primary Examiner—William M. Brewster
(74) Attorney, Agent, or Firm—Rob G. Winkle

(57) ABSTRACT

A method of fabricating a copper-containing structure, preferably within a microelectronic device, including a rapid temperature ramp from about 20 degrees Celsius up to between about 300 and 500 degrees Celsius, preferably about 400 degrees Celsius, at a rate of between about 20 and 60 degrees Celsius per second, preferably about 40 degrees Celsius per second.

21 Claims, 4 Drawing Sheets

FAST RAMP ANNEAL FOR HILLOCK SUPPRESSION IN COPPER-CONTAINING STRUCTURES

BACKGROUND OF THE INVENTION

1. Field of the Invention

The present invention relates to manufacturing of microelectronic devices. In particular, the present invention relates to the using a rapid annealing process for suppressing hillock formation in copper-containing structures of a microelectronic device.

2. State of the Art

In the fabrication of microelectronic devices, integrated circuitry is formed in and on an active surface of a microelectronic die, typically doped monocrystalline silicon. A build-up layer is then formed on the microelectronic die active surface. This buildup layer consists of dielectric layers (called "interlayer dielectric layers" or, hereinafter, "ILD layers") having conductive traces, such as bus lines, bit and word lines, logic interconnect lines and the like, extending on (approximately parallel to the microelectronic die active surface) and through each of the ILD layers in the build-up layer. This build-up layer results in a matrix of conductive traces to send and/or receive signals between components of internal integrated circuitry, and to send and/or receive signals between external electronic devices and the integrated circuitry of the microelectronic die. The build-up layers may also include conductive traces for power supply (source and ground), as well as passive components such as capacitors and resistors.

There is an on-going demand for higher performance and increased miniaturization of integrated circuit components within the microelectronic dice. As these goals are achieved, the geometry of microelectronic die integrated circuitry becomes smaller or is "scaled down". As the geometry is scaled down, the properties of the conductive traces begin to dominate the overall speed of the integrated circuitry. In order to increase the speed and reliability of the conductive traces, the electronics industry has moved away from using aluminum to using copper or copper alloys as a preferred material for the conductive traces. Although generally more expensive than aluminum, copper has a lower resistivity (resulting in lower resistance-capacitance interconnect delay) and better electromigration characteristics than aluminum.

The preferred way to process copper-containing conductive traces is to etch a line trench in the ILD layer and/or etch a via hole though the ILD layer, deposit the copper-containing material to fill the trench or hole, and then polish it back to remove any excess copper-containing material. The resulting filled trench and/or via form the conductive trace. Forming the conductive trace by this method is called the damascene process. If a trench and an underlying via hole are filled simultaneously, it is known as a dual-damascene process.

One problem that can occur in the use of copper-containing materials is the formation of hillocks due to stresses built up in the conductive traces as a result of various processing steps in forming microelectronic device. Hillocks are spike-like projections that erupt and protrude from the conductive traces in response to compressive stresses which buildup in the conductive traces. The compressive stresses result because of the differing thermal coefficient of expansion between dielectric materials and metals (more than an order of magnitude in some cases). Upon thermal cycling from fabrication processes, metals, such as copper-containing material in a build-up layer, expand more than the dielectric materials (or even the microelectronic die). As a result, compressive stresses build in the conductive traces. If the compressive stresses become too large, the stresses are relieved by the growth of hillocks.

FIG. 11 illustrates exemplary problems with hillocks within a build-up layer 200 formed in a microelectronic die (not shown). The build-up layer 200 includes a first copper-containing structure 202 and a second copper-containing structure 204 formed in a first ILD layer 206. Hillocks 210 erupting from the first copper-containing structure 202 can pierce through the second ILD layer 208 (covering the first ILD layer, the first copper-containing structure 202 and the second copper-containing structure 204) and extend into structures in the second ILD layer. FIG. 11 illustrates a passive structure as a capacitor 212 on electrical contact with a first conductive trace 214 formed in a third dielectric layer 216. Hillock extending into a capacitor 212 shorts it and renders the capacitor inoperative (and perhaps the entire microelectronic die inoperative), as will be understood to those skilled in the art. Hillocks 220 erupting from the second copper-containing structure 204 can pierce through the second ILD layer and the third ILD layer to contact a second conductive trace 214. Again, this results in a short therebetween rendering the elements and/or the entire microelectronic die inoperative. It is, of course, understood that the hillocks can extend through multiple ILD layers and may contact any structures within the build-up layer. It is further understood that the dimensions of the elements of FIG. 11 are exaggerated to aid conceptual understanding.

In the fabrication of copper-containing conductive traces, electromigration reliability can be improved by annealing (i.e., heating) the traces. Annealing increases the grain size of the copper, thereby improving electromigration reliability. It has also been found that annealing can reduce the likelihood of hillock formation. Furthermore, various techniques such as coating the traces with metal alloys, oxidizing the top surface of the traces, and the like have also been used to reduce the likelihood of hillock formation.

Although there are methods of suppressing hillock formation in copper-containing conductive traces, improvements are always sought. Therefore, it would be advantageous to develop methods for fabricating copper-containing structures, such as conductive traces, which reduces or substantially eliminates hillock formation thereon.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE ILLUSTRATED EMBODIMENT

Figure 1:
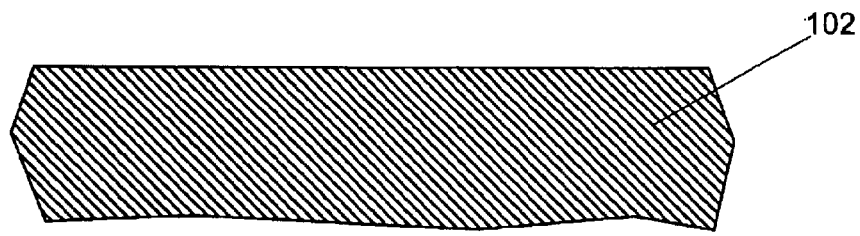
FIGS. 1–10 illustrate a method of forming a copper-containing structure within a buildup layer, according to the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention includes a method of fabricating copper-containing structure in a microelectronic die including a rapid temperature ramp annealing.

FIGS. 1–10 illustrate a method of fabricating a copper-containing structure. FIG. 1 illustrates a first interlayer dielectric (hereinafter "ILD") layer 102, including but not limited to silicon dioxide (preferred), silicon nitride, silicon oxynitride, and the like. It is, of course, understood that the first ILD layer 102 can occur anywhere within a build-up layer of a microelectronic device.

Figure 2:
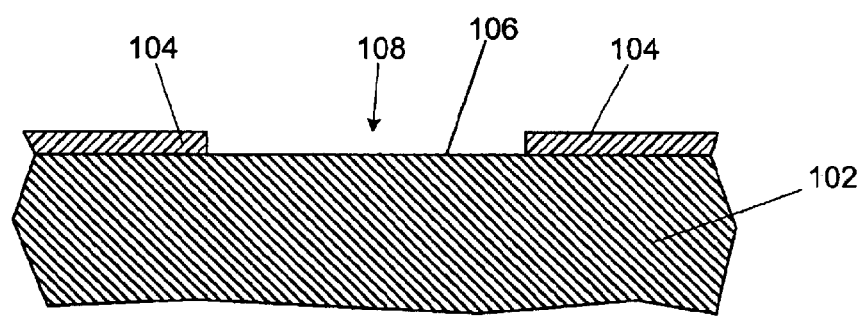
Figure 3:
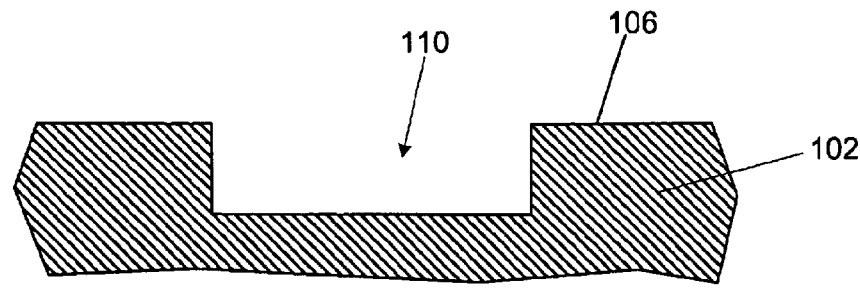

As shown in FIG. 2, a resist material 104 is patterned on a first surface 106 of the first ILD layer 102 to have an opening 108 therethrough. The first ILD layer 102 is then etched to form a recess 110 (such as a line trench or via) which extends from the first ILD layer first surface 106 into the first ILD layer 102, by any technique known in the art, and any excess resist material 104 is removed, as shown in FIG. 3.

Figure 4:
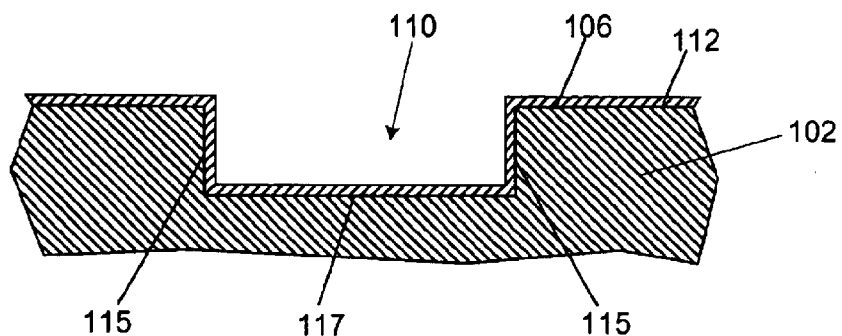

A diffusion barrier layer 112 is preferably formed on the first ILD layer first surface 106 and inside walls 115 and bottom 117 of the recess 110, such as by using physical vapor deposition or chemical vapor deposition, as shown in FIG. 4. The material used to form the diffusion barrier layer 112 is preferably selected from various materials which will prevent copper from diffusing into the first ILD layer 102 and other material layers which may surround copper-containing structure to be formed. Such materials may include, but are not limited to, silicon nitride, tantalum nitride, titanium nitride, tungsten nitride, tungsten silicon nitride, tantalum silicon nitride, titanium silicon nitride or other ternary compounds. The deposition of the diffusion barrier layer 112 is preferably performed in an environment where the pressure is between about 0.5 and 50 mtorr, and temperature between about 20 and 200 degrees Celsius to a thickness between about 50 and 1000 angstroms. It is, of course, understood that the diffusion barrier layer 112 may be unnecessary if the first ILD layer 102 is a material, which will prevent copper from diffusing therein.

Figure 5:
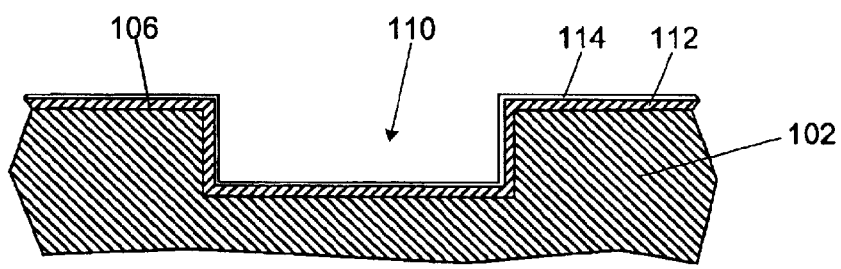

A seed layer 114 may be deposited by any known technique over the diffusion barrier layer 112, as shown in FIG. 5, to a thickness between about 500 and 5000 angstroms. The seed layer 114 provides nucleation sites for the subsequent deposition of a copper-containing material.

Figure 6:
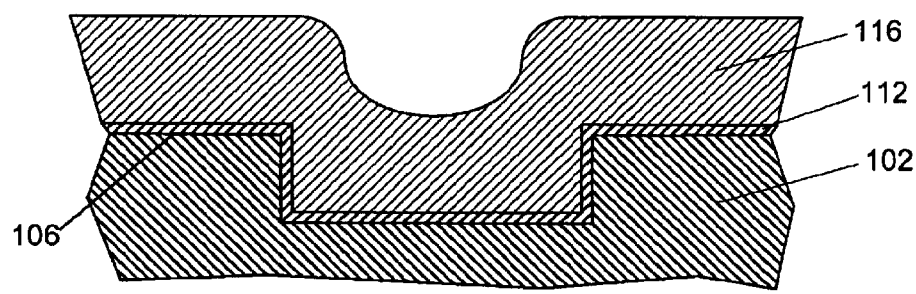

As shown in FIG. 6, a layer of copper-containing material 116 is then deposited over the seed layer 114 to a thickness between about 0.5 and 3.0 microns. The copper-containing material layer 116 may be deposited by any technique know in the art, including but not limited to plating (preferred), chemical vapor deposition, physical deposition, and the like. The copper-containing material layer 116 may be substantially pure copper or any alloy thereof.

Figure 7:
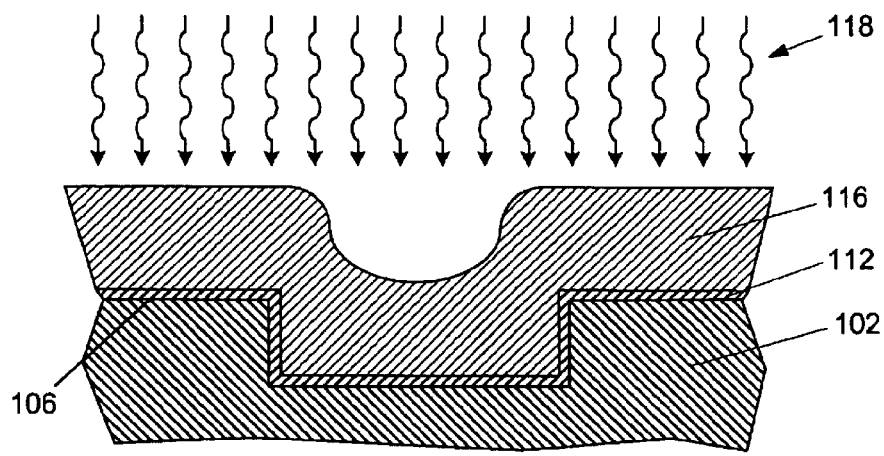

As shown in FIG. 7, the copper-containing material layer 116 is then subjected to a rapid temperature ramp anneal (represented by waving lines 118). The anneal technique comprises a temperature ramp from room temperature at about 20 degrees Celsius up to between about 300 to 500 degrees Celsius, preferably about 400 degrees Celsius, at a rate of between about 20 and 60 degrees Celsius per second, preferably about 40 degrees Celsius per second. This rapid annealing technique is in contrast to a standard annealing technique (diffusion furnace) currently used in the industry comprising a temperature ramp up to about 400 degree Celsius at a rate of about 5 degrees Celsius per minute or 0.0833 degrees Celsius per second.

Figure 8:
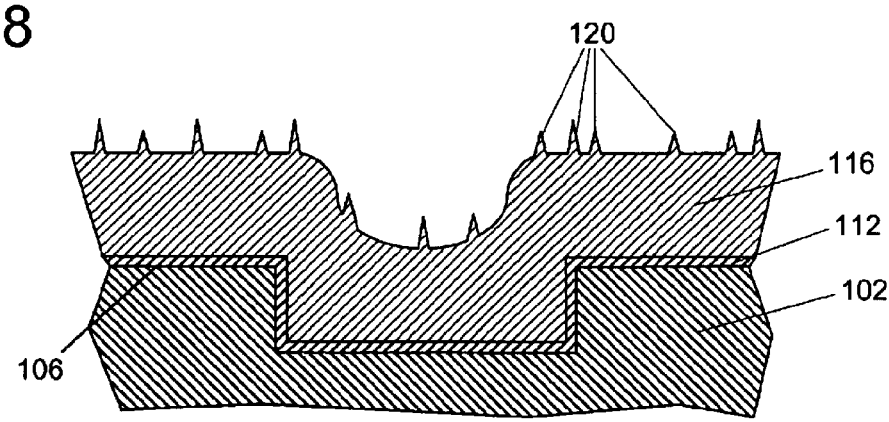

In the fabrication of a microelectronic device, the ILD layer 102 and copper structures are formed above a microelectronic wafer, such as a silicon wafer, as will be understood by those skilled in the art. During the standard diffusion furnace annealing technique, the heat transfer within and across the microelectronic wafer occurs at a quasi-equilibrium state, meaning that the temperature of the microelectronic wafer is approximately equal to that of the surrounding medium, and hence small temperature gradients develop within the microelectronic wafer. By contrast, during fast ramp anneal, for the very first few seconds of the heat transfer process, there are portions of the microelectronic wafer still at about 20 degrees Celsius, whereas other portions are at much higher temperatures, up to about 400 Celsius degrees. Because of that, there are very significant temperature gradients within and across the microelectronic wafer. Moreover, since thermal conductivity of ILD layer 102 is quite different from that of the copper-containing material layer 116, heat dissipation is faster into copper-containing material layer 116 compared to that into ILD layer 102. Thus, there is a whole dynamic of the temperature gradients within and across the wafer. The bigger the dynamics of the temperature gradients, the bigger the thermal induced stress state. Ultimately, the bigger the thermal induced stress state, the bigger the relaxation of thermal induced elastic energy through plastic deformations (hillocks) 120, as shown in FIG. 8.

Figure 9:
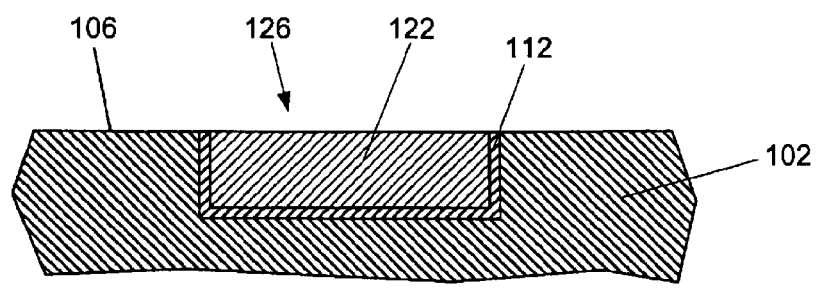

As shown in FIG. 9, the hillocks 120 (see FIG. 8), a portion of the copper-containing material layer 116, and a portion of the diffusion barrier layer 112 are removed, preferably by a chemical-mechanical polishing (CMP) technique to leave substantially only the portion of the copper-containing material layer 116 and only the portion of the diffusion barrier layer 112 which reside in the opening 108 (see FIG. 3). Thus, a conductive trace 126 is thereby formed which is electrically isolated and hillock free.

Figure 10:
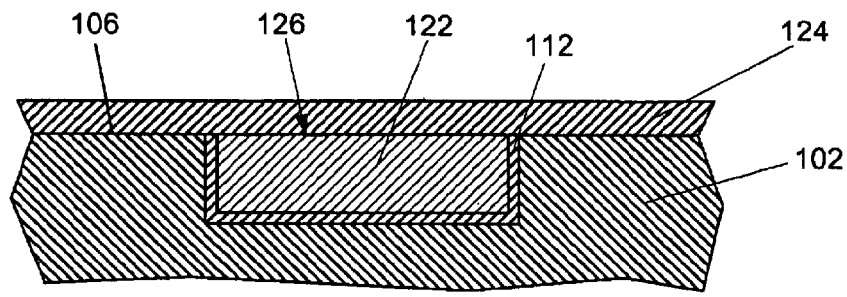
Figure 11:
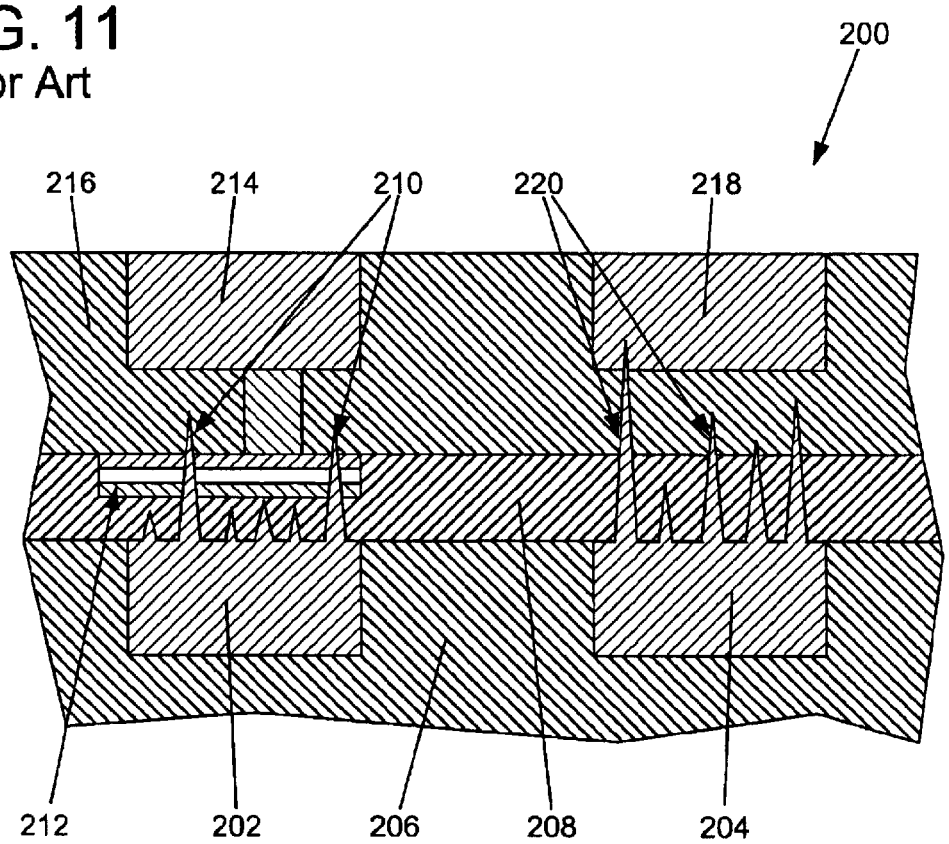
FIG. 11 is a side cross-sectional view of a build-up layer with hillock defects therein, as known in the art.

The illustrated portion of the build-up layer is completed by disposing a second ILD layer 124 over the first ILD layer 102 and the conductive trace 126, as shown in FIG. 10. The second ILD layer 124 is preferably a material, which will prevent copper from diffusing therethrough, preferably silicon nitride. For example, silicon nitride deposition has typically a fast ramp heating cycle, which subsequently creates a high thermal induced stress state in the conductive trace 126 underneath, which, of course, results in high hillock counts in standard processing (diffusion furnace pre-CMP anneal). When a furnace anneal is involved at the pre-CMP step, then there is still enough elastic energy left into the copper-containing material layer 116 which may be subsequently relaxed into multiple plastic deformations (hillocks) during silicon nitride deposition. However, if a fast ramp anneal that matches the silicon nitride deposition thermal cycle is already involved at the pre-CMP step, then there is little or no elastic energy left in the copper-containing material layer 116 which can be further relaxed into hillocks at the silicon nitride deposition step. Thus, it is preferred that with the fast ramp anneal, the relaxation of internal elastic stress in the copper is optimized by matching the pre-CMP anneal thermal cycle to that of the second ILD layer 124 deposition, as will be understood by those skilled in the art.

It is, of course, understood that the present invention is not limited to the formation of conductive traces or to microelectronic die build-up layers. The present invention can be used in the formation of various elements in the microelectronic die and can be translated in the fabrication of various electronic devices.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method of fabrication comprising heating a copper-containing structure from about 20 degrees Celsius up to between about 300 to 500 degrees Celsius at a rate of between about 20 and 60 degrees Celsius per second.

2. The method of claim 1, wherein heating said copper-containing structure comprises heating said copper-containing structure from about 20 degrees Celsius to about 400 degrees Celsius.

3. The method of claim 1, wherein heating said copper-containing structure comprises heating said copper-containing structure at a rate of about 40 degrees Celsius per second.

4. A method of fabricating a build-up layer comprising:
    forming a recess in a first interlayer dielectric;
    disposing a copper-containing material within said recess;
    heating a copper-containing structure from about 20 degrees Celsius up to between about 300 to 500 degrees Celsius at a rate of between about 20 and 60 degrees Celsius per second.

5. The method of claim 4, wherein heating said copper-containing material comprises heating said copper-containing structure from about 20 degrees Celsius to about 400 degrees Celsius.

6. The method of claim 4, wherein heating said copper-containing material comprises heating said copper-containing structure at a rate of about 40 degrees Celsius per second.

7. The method of claim 4, wherein disposing a copper-containing material over said first surface of said first interlayer dielectric layer and within said recess comprises depositing a copper-containing material layer over said first interlayer dielectric layer and within said recess.

8. The method of claim 7, further including removing a portion of said copper-containing material layer residing on a first surface of said first interlayer dielectric.

9. The method of claim 8, further comprising disposing a second interlayer dielectric layer over said first interlayer dielectric layer first surface and said copper-containing material within said recess.

10. The method of claim 8, wherein removing said portion of said copper-containing material layer comprises chemical-mechanical polishing said copper-containing material layer.

11. The method of claim 4, further comprising disposing a diffusion barrier layer on wall and bottom of said recess.

12. The method of claim 4, farther comprising disposing a seed layer within said recess prior to said disposing a copper-containing material within said recess.

13. A build-up layer formed by the process comprising:
    forming a recess in a first interlayer dielectric;
    disposing a copper-containing material within said recess;
    heating a copper-containing structure from about 20 degrees Celsius up to between about 300 to 500 degrees Celsius at a rate of between about 20 and 60 degrees Celsius per second.

14. The build-up layer of claim 13, wherein heating said copper-containing material comprises heating said copper-containing structure from about 20 degrees Celsius to about 400 degrees Celsius.

15. The build-up layer of claim 13, wherein heating said copper-containing material comprises heating said copper-containing structure at a rate of about 40 degrees Celsius per second.

16. The build-up layer of claim 14, wherein disposing a copper-containing material over said first surface of said first interlayer dielectric layer and within said recess comprises depositing a copper-containing material layer over said first interlayer dielectric layer and within said recess.

17. The build-up layer of claim 16, further including removing a portion of said copper-containing material layer residing on a first surface of said first interlayer dielectric.

18. The build-up layer of claim 17, further comprising disposing a second interlayer dielectric layer over said first interlayer dielectric layer first surface and said copper-containing material within said recess.

19. The build-up layer of claim 17, wherein removing said portion of said copper-containing material layer comprises chemical-mechanical polishing said copper-containing material layer.

20. The build-up layer of claim 13, further comprising disposing a diffusion barrier layer on wall and bottom of said recess.

21. The build-up layer of claim 13, further disposing a seed layer within said recess prior to said disposing a copper-containing material within said recess.

* * * * *

UNITED STATES PATENT AND TRADEMARK OFFICE
CERTIFICATE OF CORRECTION

PATENT NO. : 6,818,548 B2
DATED : November 16, 2004
INVENTOR(S) : Lavric et al.

It is certified that error appears in the above-identified patent and that said Letters Patent is hereby corrected as shown below:

Column 6,
Line 14, delete "farther" and insert -- further --.

Signed and Sealed this

Tenth Day of May, 2005

JON W. DUDAS
*Director of the United States Patent and Trademark Office*